United States Patent
Tseng et al.

[19]

[11] Patent Number: 6,141,119

[45] Date of Patent: Oct. 31, 2000

[54] IMAGING CARTRIDGE FOR A COMPUTER SYSTEM

[75] Inventors: Wen-Tso Tseng, Taichung; Tsung-Cheng Tsai; Kevin Wu, both of Hsinchu, all of Taiwan

[73] Assignee: Umax Data Systems Inc., Hsinchu, Taiwan

[21] Appl. No.: 09/063,549

[22] Filed: Apr. 20, 1998

[51] Int. Cl.[7] ...................................................... H04N 1/04
[52] U.S. Cl. .......................................... 358/498; 358/474
[58] Field of Search ..................................... 358/474, 496, 358/498, 471, 400, 505, 506, 487; 361/683, 686, 679; 382/313; 271/314, 315, 4.07, 4.12, 10.09, 72

[56] References Cited

U.S. PATENT DOCUMENTS

5,422,737  6/1995  Atoji et al. ............................... 358/492
5,663,813  9/1997  Pan ........................................... 358/474

*Primary Examiner*—Cheukfan Lee
*Attorney, Agent, or Firm*—W. Wayne Liauh

[57] ABSTRACT

An imaging cartridge for a computer system, which is installed in a computer system to facilitate continuous document conveying process without any removable solid document cassette and additional document positioning process, comprises a cartridge housing for accommodating required imaging components; a roller-type document feeding unit, located at one side of the cartridge housing for carrying out continuous document conveying in and out operation of the imaging cartridge; a driving unit, located inside the cartridge housing for driving the document feeding unit; and a scanning unit, located inside the cartridge housing with a distance to the document feeding unit, for converting the imaging data into electrical signals.

19 Claims, 5 Drawing Sheets

IMAGING CARTRIDGE FOR A COMPUTER SYSTEM

BACKGROUND OF THE INVENTION (1) Field of the Invention

The invention relates to an imaging cartridge for a computer system, and more particularly to which facilitates immediate document feeding process and which needs no more removable solid document cassette and no additional document positioning process.

(2) Description of the Prior Art

Conventionally, a normal imaging system in the art is an individual table-top apparatus for document and photo duplication, with a direct duplicated paper or a computer code as its output. In the later output form, the computer code from the imaging system can then be processed through a computer. However, as the technology updating and the prospective office need, the application by connecting a computer and a table-top imaging system does no longer meet the requirement of convenience in a compact working space.

Corresponding to aforesaid current need, a built-in imaging device is integrated into a computer system. The built-in imaging device can be a cartridge form and has its recording controlled and processed by the mother computer. Some work in this field have already been disclosed in Taiwan Patent Publication No. 282196, 288619, and 315016. Although existing some limitations on the original document size, yet the computer system with a built-in imaging device still has advantages in numerous manifolds; such as convenient utilization with computer software, space saving in a crowded office, lower cost than purchasing a computer system and an imaging system, and so on.

In aforesaid work, disclosed in Taiwan Patent Publication No. 282196, 288619, and 315016, the imaging device is a cartridge or cassette form to carry any necessary imaging component insides, and to be installed into the housing of the mother computer. Such work is noble, but following disadvantages still remained.

1. limitation on the original document size: During the duplicating operation in all three work, the original document should be horizontally placed inside a removable cassette on top of the imaging device; which the original document handling is similar to that in a table-top imaging system, but the document size is limited to the size smaller than the size of the removable cassette.

2. poor dust-protection ability: While positioning an original document into a built-in imaging device, a top cover (seen in work disclosed in Taiwan Patent Publication No. 282196 and 288619) of the removable cassette needs to be opened, or the removable cassette needs to be taken away from the built-in imaging device for placing an original document (seen in work disclosed in Taiwan Patent Publication No. 315016). Either operation involves temporary opening or departure of the removable cassette from the cartridge of the built-in imaging device, thus increases the possibility of dust particles entering the built-in imaging device, and consequently those dust particles pollute and damage the imaging components insides.

3. complicated operation procedure: Operation procedure of the built-in imaging device includes the retrieval of the removable cassette from the imaging device, placing the original document into the removable cassette, re-positioning the removable cassette into the imaging device, scanning inside the imaging system, and repeating previous steps for another imaging operation. The procedure involves laborious human and machine cooperation at placing document into removable cassette, which makes the operation of the built-in imaging device inconvenient to a certain extend.

4. higher equipment cost: Due to limited installation space available, the built-in imaging device utilizes a plurality of reflection mirrors to achieve the required optic path. Moreover, the built-in imaging device applies a reciprocating driving unit for performing the reciprocal scanning motion of the removable cassette. Thus, the equipment cost for a built-in imaging device can't be reduced to an acceptable range.

Therefore, an invention devoting to resolving aforesaid disadvantages of current built-in imaging device for a computer system is necessary, definitely.

SUMMARY OF THE INVENTION

Accordingly, it is a primary object of the present invention to provide an imaging cartridge for a computer system, which is installed in a computer system for performing document scanning operation.

The imaging cartridge for a computer system in accordance with the present invention is a cartridge-form scanner installed in the mother computer, which can facilitate immediate document feeding process without any removable solid document cassette and additional document positioning process. The imaging cartridge can be portable, and can be plugged into the computer housing while using for integrating the scanning capability of the imaging cartridge with the data management of the computer processor.

According to the present invention, the first embodiment of the imaging cartridge for a computer system comprises a cartridge housing for installing any required imaging component, a document feeding unit, a driving unit, a first scanning unit, a light source, a plurality of I/O ports, and a control unit.

The cartridge housing is shaped as a square box with a top surface, a bottom surface, and four lateral sides; and substantially with an inner space enough to accommodate all necessary components for imaging.

The document feeding unit, installed at one side of the cartridge housing, is a roller-type feeding device for carrying out continuous document feeding in/out operation. Preferably, the document feeding unit further comprises a feeding roller, an outer lead plate, and an inner leading plate. The feeding roller, driven by the driving unit and feeding the document by its rotation, is an extended-length roller with the center line parallel to one lateral side of the cartridge housing. Preferably, a plurality of idle rollers can be installed close to the top rim and the lowest rim of the feeding roller for providing adjustable normal and friction force while feeding the document between the idle rollers and the feeding roller.

The outer leading plate is an extended-length plate with U-shaped cross-section, which the longitudinal center line lying parallel to the lateral side and with the opening end of the U shape facing outwards and the valley end of the U shape located inside the cartridge housing. The upper and lower edges of the outer leading plate, i.e. two tips at openings of every U-shape cross-section, are the document entrance and outlet (or the document outlet and entrance) for the document feeding unit. The valley end of the outer leading plate is transparent or has a viewing slot parallel to the center line of the feeding roller for the scanning unit light accessible to the document conveyed along the inner surface of the outer leading plate, as where the feeding roller is located inside the cavity of the U-shaped outer leading plate with a substantial clearance for document conveying in between.

The inner leading plate, located inside the outer leading plate with a clearance larger than the minimum clearance between the outer leading plate and the feeding roller, is utilized to form a document passage in between with the outer leading plate for restraining the document feeding.

Preferably, according to the present invention, the feeding roller can further have a plurality of short pins over the roller surface close to both roller edges for increasing the normal and friction force while conveying the document. According to the present invention, if the document fed is one with equal-spaced binding holes at both sides, the plurality of short pins can be arranged equal-spaced and with positions corresponding to the binding holes of the document for further securing the document feeding operation.

The present invention can further comprise a flexible transparent document holder. The document holder can be formed by two overlap square sheets binding at one side at least, and three sides at most, for holding the document in between while in feeding operation and providing the protection to the document fed. Preferably, two overlap sheets are bond at only one side and leave other three sides open to avoid possible squeezing in the document passage. In another embodiment of the document holder, two series of equal-spaced punch holes can be located to two parallel sides of the document holder for going with the short pins on the surface of the feeding roller. According to the present invention, the smaller width of the document holder is less than the length of the outer leading plate, and the thickness of the document holder can't be larger than the clearance between the outer leading plate and the inner leading plate.

The driving unit for driving the document feeding unit, located inside one lateral side of the cartridge housing perpendicular to the center line of the feeding roller, further comprises a motor and a transmitting means for connecting the motor and the feeding roller of the document feeding unit. According to the present invention, the motor is capable of easy control cooperation with the computer, and can be a step motor or a DC motor. The transmitting means can be a pulley-belt set, a gear set, or any the like.

The first scanning unit for performing the document imaging and for converting the imaging data into electrical signals is located inside the cartridge housing with an appropriate distance to the document feeding unit, which the distance is substantial for optic path of the first scanning unit.

The light source, for providing sufficient reflection light intensity in scanning operation, is located inside the cartridge housing between the document feeding unit and the first scanning unit.

The plurality of I/O ports, located on the cartridge housing and electrically connected to the control unit, are terminals for importing the signal from the computer and exporting the imaging data to the computer.

The control unit is located inside the cartridge housing for integrating the action of the driving unit, the light source, the first scanning unit, and the plurality of I/O ports.

In the first embodiment of the present invention, the first scanning unit is obvious a CCD-type device. In another embodiment of the imaging cartridge for a computer system in accordance with the present invention, the first scanning unit of the first embodiment can be replaced with a CIS-type device, a CMOS image sensor, or any the like. Certainly, it is well known in the art that proper adjustment of the scanning unit position and the light source as well as the coding of the control unit are necessary while replacing a new type of scanning unit. For example, while using a CIS-type device or a COMS image sensor, the scanning unit needs to be adjusted closely toward the document feeding unit.

It is another object of the present invention to provide an imaging cartridge for a computer system required no reflection mirror, which the application of the roller type document feeding unit saves sufficient interior space of the cartridge housing for optic path to install a CCD scanning unit.

It is a further object of the present invention to provide an easy-operation imaging cartridge for a computer system, which the continuous document in/out processing of the roller-type document feeding unit avoids the repeatedly plugging and departing operation of the removable document cassette in the prior art, and thus reduces the occurrence of possible damage from such repeating imaging component downloading.

It is one more object of the present invention to provide a better dust-protection imaging cartridge for a computer system, which the design of the document feeding unit prevents from any downloading of component in the imaging cartridge while in application, and thus reduces the possibility of particle entering the cartridge housing by the induced air flow.

It is another more object of the present invention to provide an imaging cartridge for a computer system, which the application of the feeding roller and the forming of the document passage restraining only the document width, not the length, makes versatile the application range of the original document and also provides a wider opening for document than the prior art does.

It is a further more object of the present invention to provide a low-cost imaging cartridge for a computer system, which no reflection mirror is necessary, and which thus the present invention wipes out the expense from service requirement from dirt and dislocation of the mirrors in the prior art.

All these objects are achieved by the imaging cartridge for a computer system described below.

BRIEF DESCRIPTION OF THE DRAWINGS

The present invention will now be specified with reference to its preferred embodiments illustrated in the drawings, in which.

DESCRIPTION OF THE PREFERRED EMBODIMENTS

The invention disclosed herein is directed to an imaging cartridge for a computer system. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1:
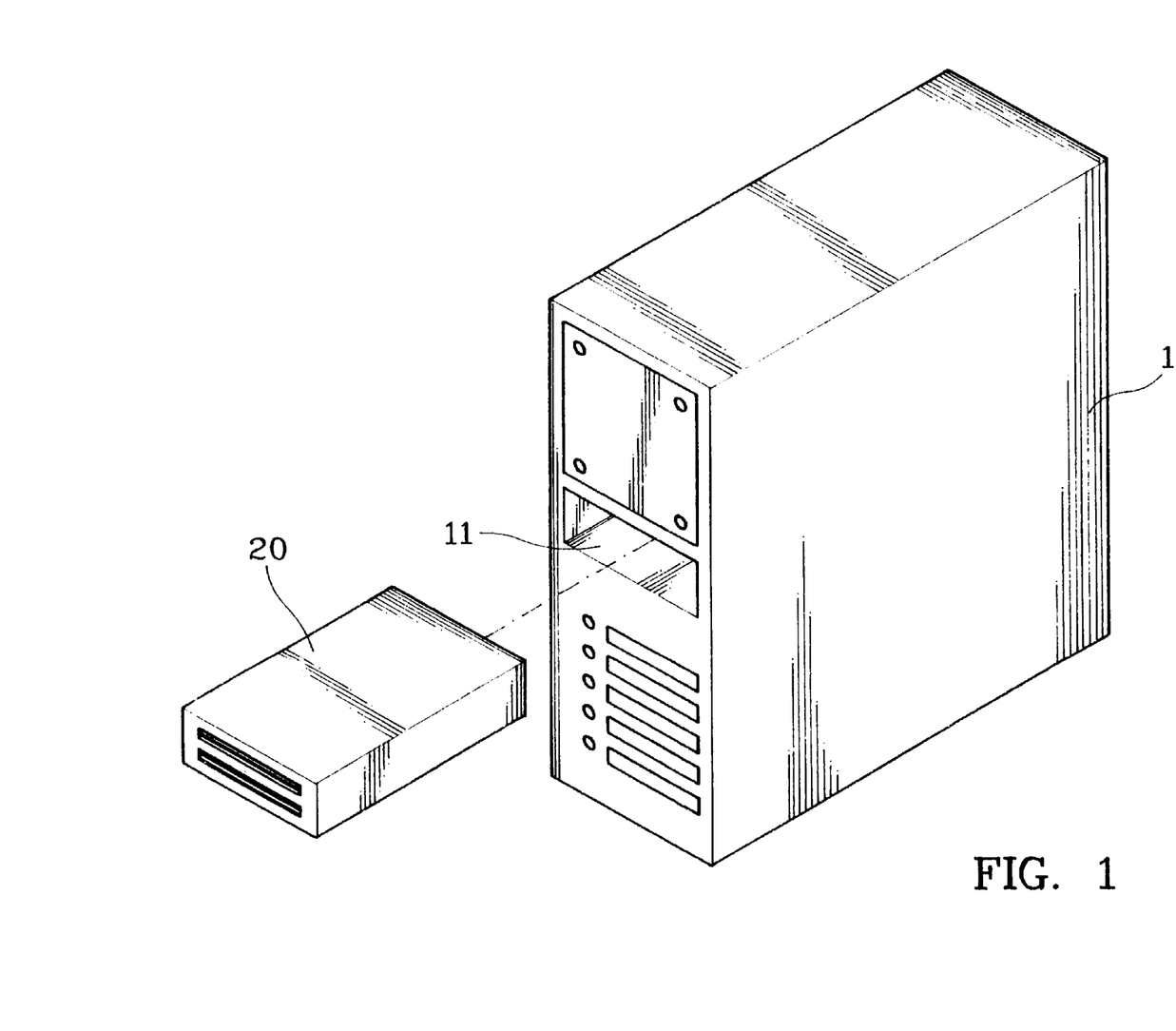
FIG. 1 is a perspective view of a computer system with an imaging cartridge for a computer system in accordance with the present invention.

Referring now to FIG. 1, the imaging cartridge 20 for a computer system in accordance with the present invention is a cartridge-form scanner installed in the mother computer 1, which can facilitate immediate document feeding process without any removable solid document cassette and additional document positioning process. Preferably, The imaging cartridge 20 can be portable, and can be plugged into an accommodating slot 11 of the computer housing, while using for integrating the scanning capability of the imaging cartridge with the data management of the computer processor.

Figure 2:
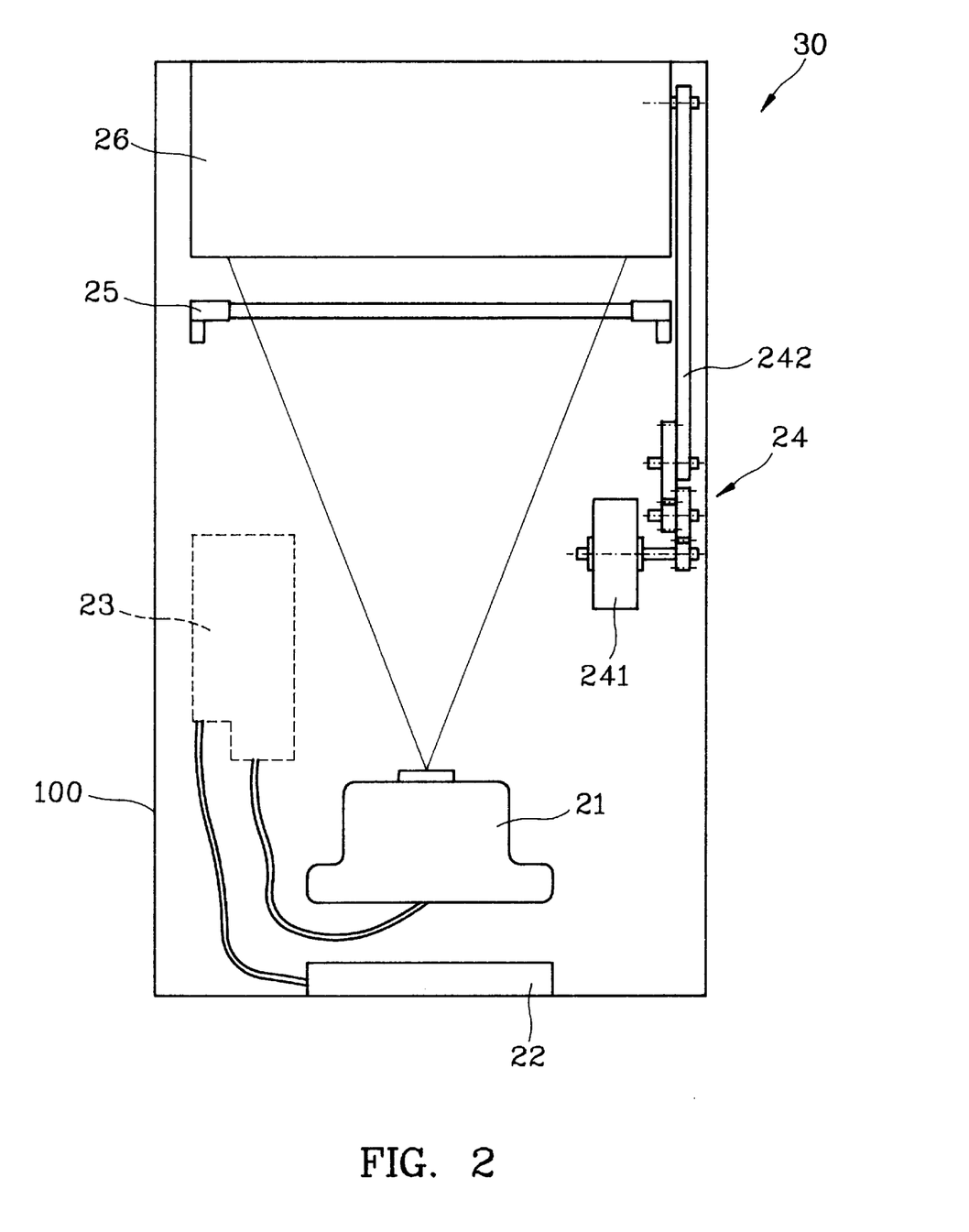
FIG. 2 is a schematic view of the first embodiment of the imaging cartridge for a computer system according to the present invention.

Referring now to FIG. 2, the first embodiment 30 of the imaging cartridge for a computer system according to the present invention comprises a cartridge housing 100 for installing any required imaging component, a document feeding unit 26, a driving unit 24, a first scanning unit 21, a light source 25, a plurality of I/O ports 22, and a control unit 23.

The cartridge housing 100 is shaped as a square box with a top surface, a bottom surface, and four lateral sides; and substantially with an inner space enough to accommodate the document feeding unit 26, the driving unit 24, the first scanning unit 21, the light source 25, a plurality of the I/O ports 22, and the control unit 23.

Figure 3:
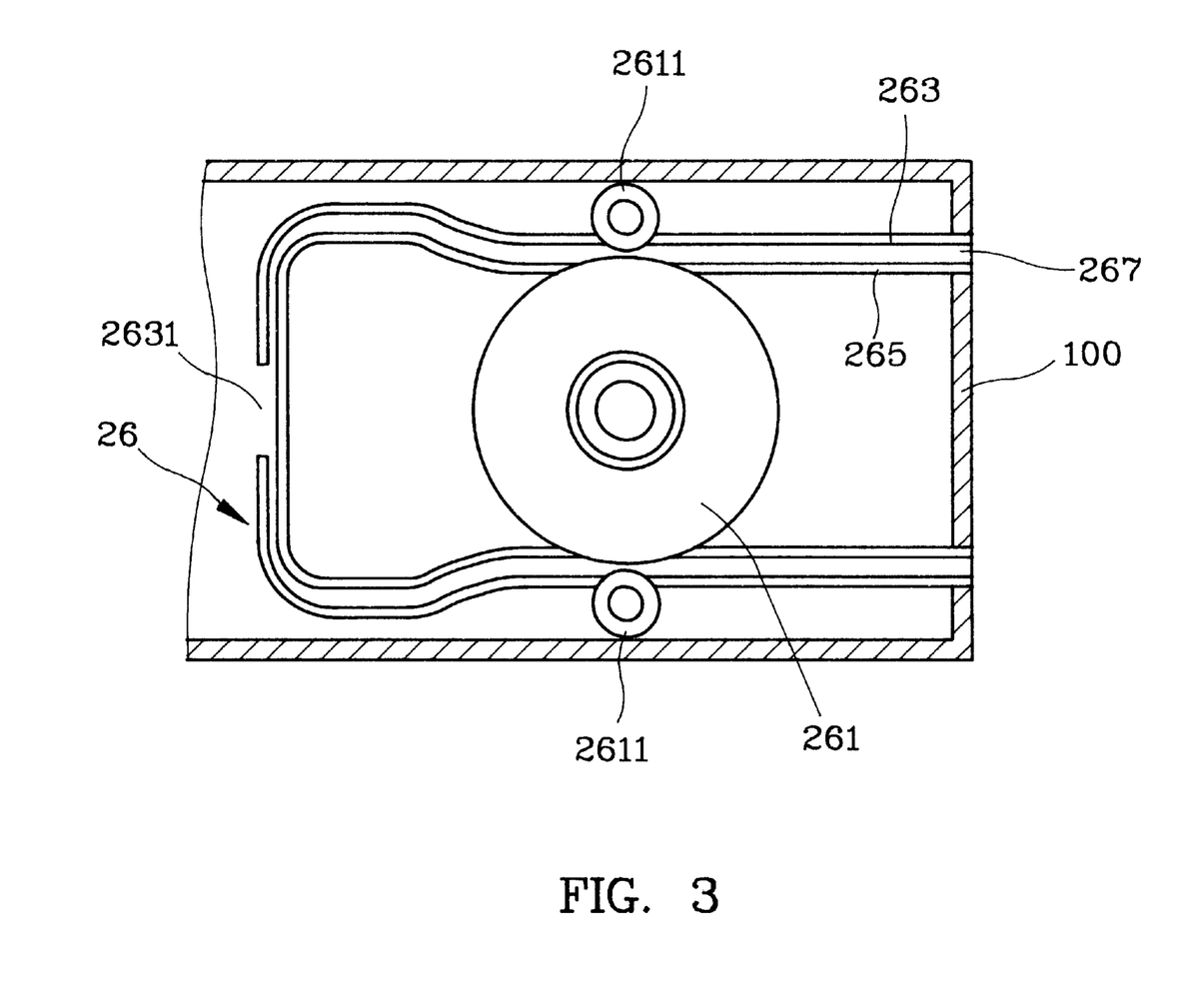
FIG. 3 is a schematic side view of the preferred document feeding mechanism of the imaging cartridge for a computer system according to the present invention.

The document feeding unit 26, which is installed at one side of the cartridge housing 100, is a roller-type feeding device for carrying out continuous document feeding in/out operation. Referring to FIG. 3, the document feeding unit 26 further comprises preferably a feeding roller 261, an outer lead plate 263, and an inner leading plate 265. According to the present invention, the feeding roller 261, driven by the driving unit 24 and feeding the document by its rotation, can be an extended-length roller with the center line parallel to one lateral side of the cartridge housing 100.

Preferably, a plurality of idle rollers 2611 can be installed, with a proper clearance, close to the top rim and the lowest rim of the rolling surface of the feeding roller 261 for providing adjustable normal and friction force while feeding the document between the idle rollers 2611 and the feeding roller 261. The adjustability of the idle rollers 2611 can be achieved by utilizing adjustable pivot shafts to the idle rollers 2611 for adjusting the clearance between the feeding roller 261 and the idle roller 2611. Also, the arrangement of the idle rollers 2611 can be two extended-length rollers parallel to the top or and the lowest rims of the rolling surface of the feeding roller 261, or two sets of rollers with their pivot shafts lining along two lines parallel to the top or and the lowest rims of the rolling surface of the feeding roller 261.

The outer leading plate 263 according to the present invention is an extended-length plate with U-shaped cross-section, which the longitudinal center line of the outer plate 263 is lying parallel to the lateral side the document feeding unit 26 located (i.e. parallel to the center line of the feeding roller 261), with the opening end of the U shape facing outwards and the valley end of the U shape located inside the cartridge housing 100. The upper and lower edges of the outer leading plate 263, i.e. two tips at openings of every U-shape cross-section, are the document entrance and outlet (or the document outlet and entrance) for the document feeding unit 26. The valley end of the outer leading plate 263 is transparent or has a viewing slot 2631 parallel to the center line of the feeding roller 261 for the first scanning unit 21 light accessible to the document conveyed along the inner surface of the outer leading plate 263. As shown in FIG. 3, the feeding roller 261 is located inside the cavity of the U-shaped outer leading plate 263 with a substantial clearance for document conveying in between. Moreover, the outer leading plate 263 can further have a plurality of apertures to satisfy the installation requirement of the idle rollers 2611.

According to the present invention, the inner leading plate 265, which is located inside the outer leading plate 263 with a clearance larger than the minimum clearance between the outer leading plate 263 and the feeding roller 261, is utilized to form a document passage 267 in between with the outer leading plate 263 for restraining the document feeding. Preferably, the inner leading plate 265 can be U-shaped like the outer leading plate 263 as well. The U shape of the inner leading plate 265 is installed inside the U shape of the outer leading plate 263, and the feeding roller 261 is located inside the cavity of the inner leading plate 265. The upper and lower edges of the inner leading plate 265, i.e. two tips at openings of every U-shape cross-section, provide the document entrance and outlet (or the document outlet and entrance) for the document feeding unit 26 by cooperating with the upper and lower edges of the outer leading plate 263. Also, the inner leading plate 265 can further have a plurality of apertures to satisfy the installation requirement of the feeding roller 261.

Preferably, according to the present invention, the feeding roller 261 can further have a plurality of short pins over the roller surface close to both roller edges for increasing the normal and friction force while conveying the document in the document passage 267. According to the present invention, if the document fed is one with equal-spaced binding holes at both sides (like the output sheet from a continuous-paper printer), the plurality of short pins can be arranged equal-spaced and with positions corresponding to the binding holes of the document for further securing the document feeding operation.

Figure 5A:
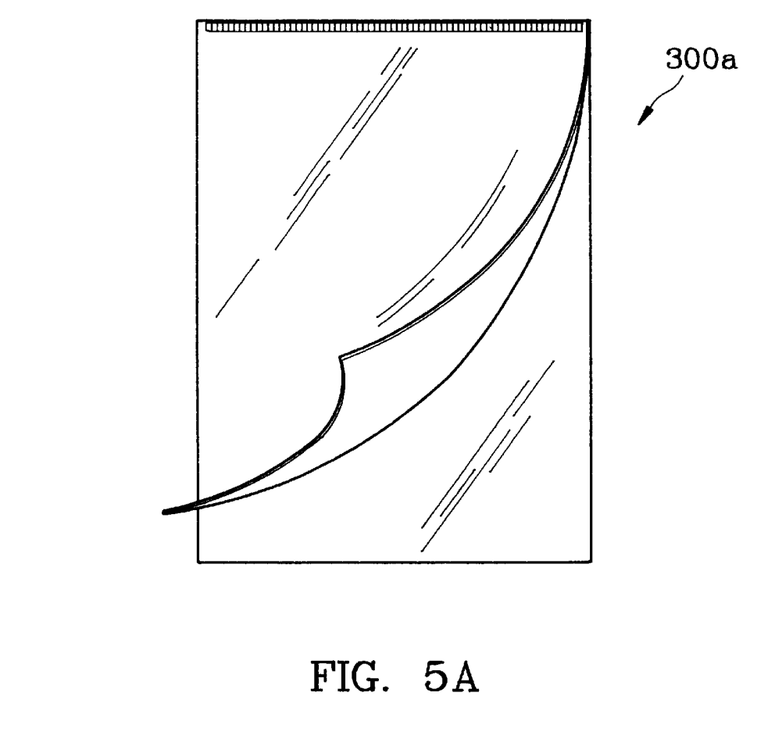
FIG. 5A is a perspective view of the preferred embodiment of the document holder for the imaging cartridge for a computer system according to the present invention.
Figure 5B:
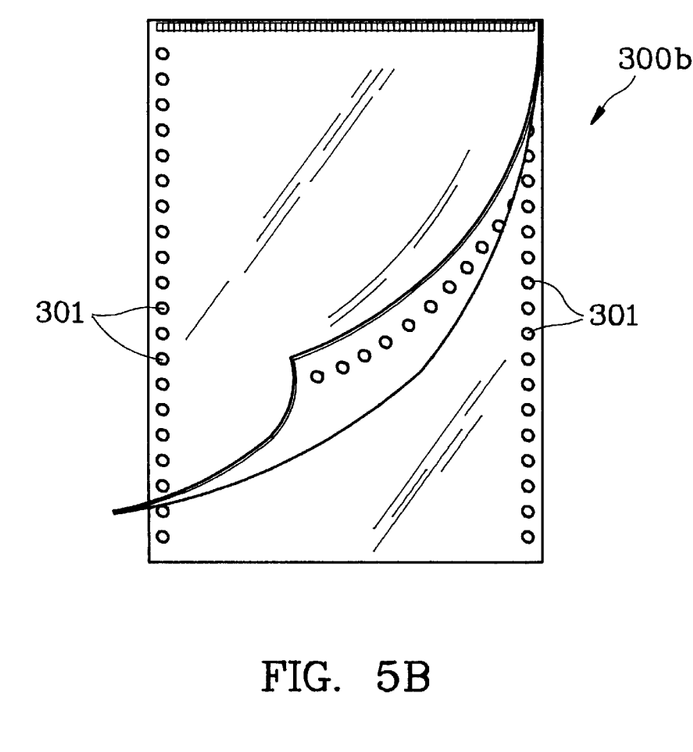
FIG. 5B is a perspective view of another embodiment of the document holder for the imaging cartridge for a computer system according to the present invention.

Referring now to FIG. 5A and FIG. 5B, the present invention can further comprise a flexible transparent document holder 300a or 300b. The document holder 300a or 300b can be formed by two overlap square sheets binding at one side at least, and three sides at most, for holding the document in between, while in feeding operation and for providing the protection to the document fed. Preferably, two overlap sheets are bond at only one side and leave other three sides open to avoid possible squeezing in the document passage 267. The binding side of the document holder 300a or 300b should be the leading edge in feeding the document into the document passage 267.

In another embodiment of the document holder 300b, two series of equal-spaced punch holes 301 can be located to two parallel sides, other than the leading sides, of the document holder 300b for going with the short pins on the surface of the feeding roller. According to the present invention, the smaller width of the document holder 300a or 300b is less than the length of the outer leading plate 263, and the thickness of the document holder 300a or 300b can't be larger than the clearance between the outer leading plate 263 and the inner leading plate 265 to avoid possible jam in the document passage 267.

Referring now back to FIG. 2, the driving unit 24, for driving the document feeding unit 26 and located inside one lateral side of the cartridge housing 100 perpendicular to the center line of the feeding roller 261, further comprises a motor 241 and a transmitting means 242 for connecting the motor 241 and the feeding roller 261 of the document feeding unit 26. According to the present invention, the motor 241 should be capable of easy control cooperation with the computer, and therefore can be a step motor or a DC motor. The transmitting means 242 can be a pulley-belt set, a gear set, or any the like.

The first scanning unit 21, for performing the document imaging and for converting the imaging data into electrical signals, is located inside the cartridge housing 100 with an appropriate distance to the document feeding unit 26, which the distance is substantial for optic path of the first scanning unit 21; so that no reflection mirror is necessary in accordance with the present invention. In application, the first scanning unit 21 images the document conveyed in the document passage 267 at the valley end of the U-shaped outer leading plate 263, where either the valley end is transparent, or a viewing slot 2631 exists.

According to the present invention, the light source 25, for providing sufficient reflection light intensity in scanning operation, is located inside the cartridge housing 100 between the document feeding unit 26 and the first scanning unit 21. Certainly, the installation of the light source 25 should avoid possible interference between the document feeding unit 26 and the first scanning unit 21.

The plurality of I/O ports 22, located on the cartridge housing 100 and electrically connected to the control unit 23, are terminals for importing the signal from the computer and exporting the imaging data to the computer.

The control unit 23 is located inside the cartridge housing 100 for integrating the action of the driving unit 24, the light source 25, the first scanning unit 21, and the plurality of I/O ports 22.

Figure 4:
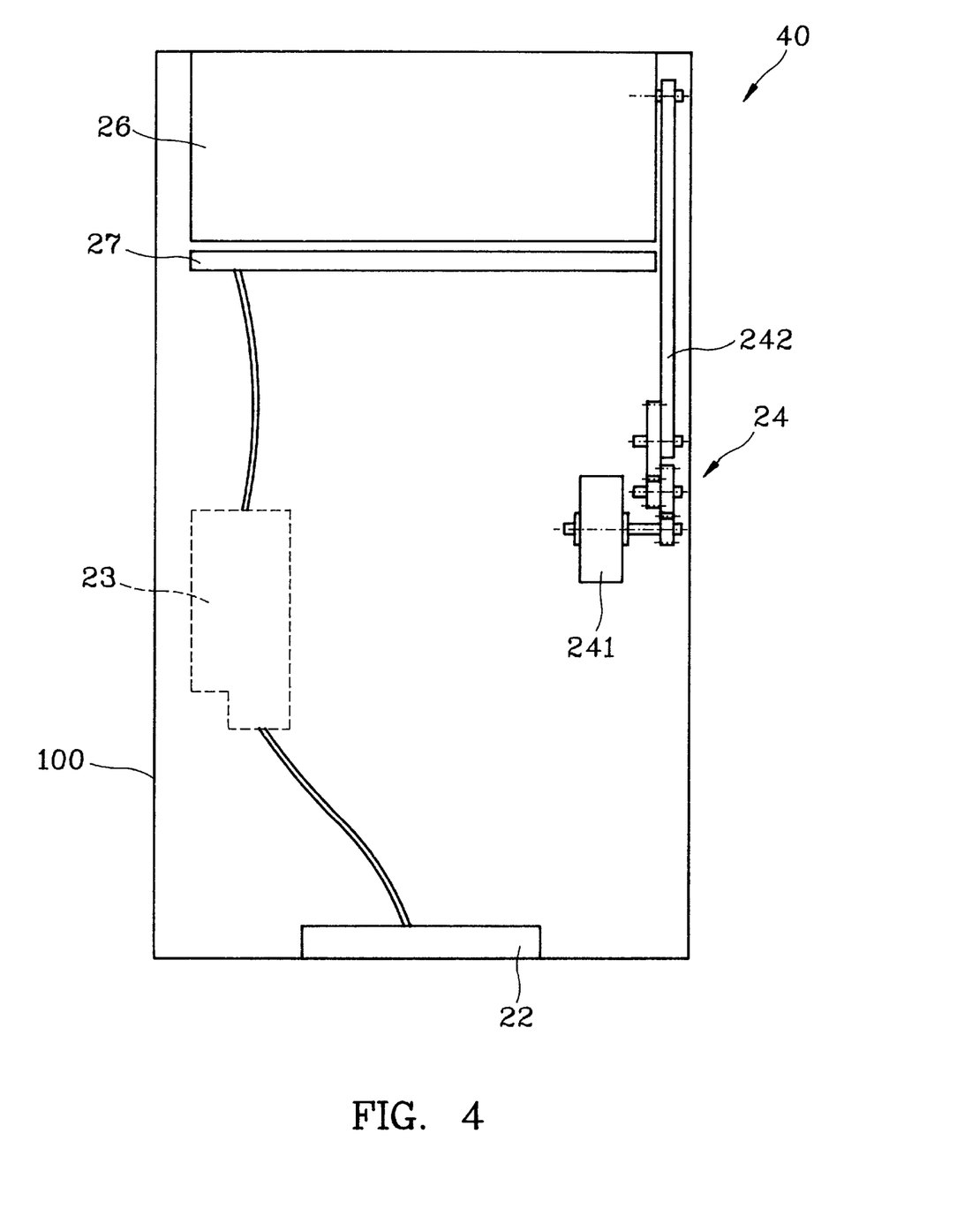
FIG. 4 is a schematic view of another embodiment of the imaging cartridge for a computer system according to the present invention.

In the first embodiment 30 of the present invention illustrated in FIG. 2, the first scanning unit 21 is obvious a CCD-type device, which need a distance as an optic path between the first scanning unit 21 and the document feeding unit 26. Referring now to FIG. 4, the another embodiment 40 of the imaging cartridge for a computer system according to the present invention comprises a cartridge housing 100, a document feeding unit 26, a driving unit 24, a second scanning unit 27, a plurality of I/O ports 22, and a control unit 23. To avoid possible ambiguity in the components of the another embodiment 40 and the preferred embodiment 30, those parts with same function and setup are labeled as the same numbering in two embodiments 30 and 40, in FIG. 2 and FIG. 4. Apparently, the major difference of the another embodiment 40 to the preferred embodiment 30 is appearance of the second scanning unit 27 which replaces the first scanning unit 21 of the first embodiment 30. The second scanning unit 27 is located closely to the document driving unit 26, which can be a CIS-type device, a CMOS image sensor, or any the like.

Certainly, it is well known in the art that proper change on the location of the second scanning unit 27, the light source, and the coding of the control unit 23 are necessary while replacing a new type of scanning unit.

While the present invention has been particularly shown and described with reference to preferred embodiments, it will be understood by those skilled in the art that various changes in form and detail may be without departing from the spirit and scope of the present invention.

What is claimed is:

1. An imaging cartridge for a computer system, which is installed in the computer to facilitate a continuous document conveying process without any removable solid document cassette and additional document positioning process, comprising:

a cartridge housing, which has a top surface, a bottom surface, and four lateral sides to form a square box with substantial inner space for accommodating required imaging components;

a document feeding unit, which is a roller-type feeding device installed at one side of the cartridge housing, for carrying out continuous document conveying in and out operation of the imaging cartridge;

a driving unit, located inside the cartridge housing for driving the document feeding unit; and a scanning unit, located inside the cartridge housing with a distance to the document feeding unit, for converting the imaging data into electrical signals;

wherein said the document feeding unit further comprises:

a feeding roller, which is an extended-length roller with the center line parallel to said lateral side of said cartridge housing, and is driven by said driving unit and feeding the document by its rotation;

an outer leading plate, which is an extended-length plate with its longitudinal center line lying parallel to said lateral side and with a U-shaped cross-section, wherein the opening end of the U-shaped cross-section faces outwards of said imaging cartridge with the upper and lower edges thereof as the document entrance and outlet, respectively, of said imaging cartridge, the valley end of the U-shaped cross-section is light penetrable, and the feeding roller is located inside the cavity of the U-shaped cross-section with a clearance from the outer leading plate for conveying document in between; and an inner leading plate, located inside the outer leading plate with a clearance larger than the minimum clearance between the outer leading plate and the feeding roller.

2. The imaging cartridge for a computer system according to claim 1, wherein said outer leading plate is transparent.

3. The imaging cartridge for a computer system according to claim 1, wherein said valley end of said outer leading plate has a viewing slot parallel to the center line of said feeding roller.

4. The imaging cartridge for a computer system according to claim 1, wherein said feeding roller further has a plurality of short pins over the roller surface close to both roller edges for increasing the normal and friction force while conveying the document.

5. The imaging cartridge for a computer system according to claim 1, wherein said feeding roller further has a plurality of equal-spaced short pins over the roller surface close to both roller edges for increasing the normal and friction force while conveying the document.

6. The imaging cartridge for a computer system according to claim 5 further comprises a flexible transparent document holder, which is formed by two overlap square sheets binding at one side at least, and three sides at most, for holding the document in between; and which has two series of equal-spaced punch holes located to two parallel sides whichof for going with said short pins on the surface of said feeding roller.

7. The imaging cartridge for a computer system according to claim 6, wherein said document holder has one, and only one, binding side whichof as the leading edge and leaves other three sides whichof open.

8. The imaging cartridge for a computer system according to claim 1, wherein said document feeding unit further comprises a plurality of idle rollers installed close to the top rim and the lowest rim of said feeding roller for providing adjustable normal and friction force while feeding the document between the idle rollers and said feeding roller.

9. The imaging cartridge for a computer system according to claim 1 further comprises a flexible transparent document holder, which is formed by two overlap square sheets binding at one side at least, and three sides at most, for holding the document in between and for protecting the document while in imaging operation.

10. The imaging cartridge for a computer system according to claim 9, wherein said document holder has one, and only one, binding side whichof as the leading edge and leaves other three sides whichof open.

11. The imaging cartridge for a computer system according to claim 1, wherein said driving unit further comprises a motor and a pulley-belt set driven by the motor and connected to said document feeding unit.

12. The imaging cartridge for a computer system according to claim 11, wherein said motor is a DC motor.

13. The imaging cartridge for a computer system according to claim 11, wherein said motor is a step motor.

14. The imaging cartridge for a computer system according to claim 1, wherein said driving unit further comprises a motor and a gear set driven by the motor and with the output connected with said document feeding unit.

15. The imaging cartridge for a computer system according to claim 14, wherein said motor is a DC motor.

16. The imaging cartridge for a computer system according to claim 14, wherein said motor is a step motor.

17. The imaging cartridge for a computer system according to claim 1, wherein said scanning unit is a CCD-type (charge-coupled device-type) imaging device.

18. An imaging cartridge for a computer system, which is installed in the computer to facilitate a continuous document conveying process without any removable solid document cassette and additional document positioning process, comprising:
   a cartridge housing, which has a top surface, a bottom surface, and four lateral sides to form an square box with substantial inner space for accommodating required imaging components;
   a document feeding unit, which is a roller-type feeding device installed at one side of the cartridge housing, for carrying out continuous document conveying in and out operation of the imaging cartridge;
   a driving unit, located inside the cartridge housing for driving the document feeding unit; and
   a scanning unit, which is a CIS-type (contact image sensor-type) device, located closed to the document feeding unit, for converting the imaging data into electrical signals;
   wherein said the document feeding unit further comprises:
      a feeding roller, which is an extended-length roller with the center line parallel to said lateral side of said cartridge housing, and is driven by said driving unit and feeding the document by its rotation;
      an outer leading plate, which is an extended-length plate with its longitudinal center line lying parallel to said lateral side and with a U-shaped cross-section, wherein the opening end of the U-shaped cross-section faces outwards of said imaging cartridge with the upper and lower edges thereof as the document entrance and outlet, respectively, of said imaging cartridge, the valley end of the U-shaped cross-section is light penetrable, and the feeding roller is located inside the cavity of the U-shaped cross-section with a clearance from the outer leading plate for conveying document in between; and
      an inner leading plate, located inside the outer leading plate with a clearance larger than the minimum clearance between the outer leading plate and the feeding roller.

19. An imaging cartridge for a computer system, which is installed in the computer to facilitate a continuous document conveying process without any removable solid document cassette and additional document positioning process, comprising:
   a cartridge housing, which has a top surface, a bottom surface, and four lateral sides to form an square box with substantial inner space for accommodating required imaging components;
   a document feeding unit, which is a roller-type feeding device installed at one side of the cartridge housing, for carrying out continuous document conveying in and out operation of the imaging cartridge;
   a driving unit, located inside the cartridge housing for driving the document feeding unit; and
   a scanning unit, which is a CMOS-type (complementary metal oxide semiconductor-type) device, located closed to the document, feeding unit, for converting the imaging data into electrical signals;
   wherein said the document feeding unit further comprises:
      a feeding roller, which is an extended-length roller with the center line parallel to said lateral side of said cartridge housing, and is driven by said driving unit and feeding the document by its rotation;
      an outer leading plate, which is an extended-length plate with its longitudinal center line lying parallel to said lateral side and with a U-shaped cross-section, wherein the opening end of the U-shaped cross-section faces outwards of said imaging cartridge with the upper and lower edges thereof as the document entrance and outlet, respectively, of said imaging cartridge, the valley end of the U-shaped cross-section is light penetrable, and the feeding roller is located inside the cavity of the U-shaped cross-section with a clearance from the outer leading plate for conveying document in between; and
      an inner leading plate, located inside the outer leading plate with a clearance larger than the minimum clearance between the outer leading plate and the feeding roller.

* * * * *